United States Patent [19]

Murai

[11] Patent Number: 5,408,123
[45] Date of Patent: Apr. 18, 1995

[54] FUNCTIONAL CHIP TO BE USED WHILE STACKED ON ANOTHER CHIP AND STACK STRUCTURE FORMED BY THE SAME

[76] Inventor: Takashi Murai, Futo 1317-1401, Itoh City, Shizuoka Prefecture, Japan

[21] Appl. No.: 197,932

[22] Filed: Feb. 17, 1994

[30] Foreign Application Priority Data

Feb. 19, 1993 [JP] Japan .................... 5-030909

[51] Int. Cl.6 ........................... H01L 23/28
[52] U.S. Cl. ..................... 257/531; 257/777
[58] Field of Search ............ 257/686, 531, 928, 777

[56] References Cited

U.S. PATENT DOCUMENTS

4,894,706 1/1990 Sato et al. .................. 257/686
5,157,576 10/1992 Takaya .................... 257/531

Primary Examiner—Robert P. Limanek
Assistant Examiner—Roy Potter

[57] ABSTRACT

A functional chip and a stack structure of such functional chips that enables high mounting density to be readily achieved. The functional chip has a functional element, such as a semiconductor element including an integrated circuit on a substrate, first and second insulating films respectively on first and second opposed surfaces of the functional element, and first and second magnetic films respectively on the first and second insulating films. The first and second magnetic films are divided into regions and magnetized such as to have magnetic poles arranged in a prescribed pattern. A plurality of such functional chips are stacked on each other to form the stack structure. Among the functional chips in the stack structure, adjacent functional chips are stacked on each other in such a manner that the first magnetic film of one of the pair of functional chips is held to the second magnetic film of the other functional chip by magnetic force. For this purpose, that first magnetic film and that second magnetic film may have magnetic poles of unlike polarities at corresponding positions of the films.

12 Claims, 6 Drawing Sheets

| N | N | S | --------- | N | --------- | N | 4a |
|---|---|---|---|---|---|---|---|
| N | N | S | | | | N | |
| S | S | N | | | | ⋮ | |
| ⋮ | ⋮ | | | | | ⋮ | |
| | | | | | | ⋮ | |
| N | N | | | | | S | |

|     | A11 | A12 | A13 | A14 | A15 | A16 | A17 | A18 | A19 | A10 | • | • |
|-----|-----|-----|-----|-----|-----|-----|-----|-----|-----|-----|---|---|
| B11 | N   | N   | S   | S   | S   | N   | S   | S   | N   | N   | • | • |
| B12 | N   | N   | •   | •   | •   | •   | •   | •   | •   | •   | • | • |
| B13 | S   | •   | S   | N   | N   | S   | N   | S   | S   | S   | • | • |
| B14 | S   | •   | N   | •   | •   | •   | •   | •   | •   | •   |   |   |
| B15 | S   | •   | N   | •   | •   | •   | •   | •   | •   | •   |   |   |
| B16 | N   | •   | S   | •   | •   | •   | •   | •   | •   | •   |   |   |
| B17 | S   | •   | N   | •   | •   | •   | •   | •   | •   | •   |   |   |
| B18 | S   | •   | S   | •   | •   | •   | •   | •   | •   | •   |   |   |
| B19 | N   | •   | S   | •   | •   | •   | •   | •   | •   | •   |   | • |
| B10 | N   | •   | S   | •   | •   | •   | •   | •   | •   | •   |   | • |

ROW →

COLUMN →

FIG. 5

| C | | A11 A12 | | | | | | A19 A10 A21 A22 | | | | | | | | | A20 | D |
|---|---|---|---|---|---|---|---|---|---|---|---|---|---|---|---|---|---|---|
| | | N | S | S | S | N | S | N | S | S | N | S | S | N | S | S | N | |
| I | | S | S | S | N | N | S | N | N | S | S | S | N | | | | | 4 |
| II | | | S | S | N | N | S | N | S | S | N | S | N | S | | | | 6 |
| III | | | | S | S | S | N | N | S | N | N | S | S | N | S | | | 6 |
| IV | | | | | S | N | N | S | N | S | N | S | N | N | S | N | | 6 |
| V | | | | | | S | S | N | S | N | S | N | S | S | N | N | | 6 |
| VI | | | | | | | S | S | N | N | S | N | N | S | S | N | | 6 |
| VII | | | | | | | | S | S | S | N | N | N | N | S | N | | 6 |
| VIII | | | | | | | | | S | S | S | N | S | S | S | N | S | 6 |
| IX | | | | | | | | | | S | S | N | N | S | N | S | S | 4 |

FIG. 6

| C | A11 | A12 | A13 | A14 | A15 | A16 | A17 | A18 | A19 | A10 | • | • | • | A20 | D |
|---|-----|-----|-----|-----|-----|-----|-----|-----|-----|-----|---|---|---|-----|---|
|   | N | N | S | S | N | S | S | N | N | N | N | S | S | S | N |   |
| I | S | (s) |   |   |   |   |   |   |   |   |   |   |   |   |   | 4 |
| II | S | N | (s) |   |   |   |   |   |   |   |   |   |   |   |   | 6 |
| III | N | S | S | (s) |   |   |   |   |   |   |   |   |   |   |   | 4 |
| IV | N | N | S | S | (s) |   |   |   |   |   |   |   |   |   |   | 4 |
| V | S | N | N | N | S | (s) |   |   |   |   |   |   |   |   |   | 5 |
| VI | S | N | N | S | N | S | (s) |   |   |   |   |   |   |   |   | 5 |
| VII | S | S | N | N | N | N | S | (s) |   |   |   |   |   |   |   | 4 |
| VIII | N | N | N | S | N | N | N | S | (s) |   |   |   |   |   |   | 4 |
| IX | N | (s) | S | N | S | N | S | N | N | N | S | N | S | S | (s) |   | 4 |

FUNCTIONAL CHIP TO BE USED WHILE STACKED ON ANOTHER CHIP AND STACK STRUCTURE FORMED BY THE SAME

BACKGROUND OF THE INVENTION

1. Field of the Invention

The present invention relates to a functional chip to be used while stacked on another chip and a stack structure formed by such stacked functional chips, the chips and the stack structure thereof being directed to achieving high mounting density. In particular, the present invention relates to a very large scale integrated (VLSI) circuit fabricated by stacking a plurality of semiconductor chips on each other.

2. Description of the Related Art

In the conventional practice in which semiconductor chips are packaged one by one, since the packaged semiconductor chips inevitably have increased volumes, it is difficult to improve mounting density. In order to improve mounting density, a plurality of substrates on which the semiconductor chips are mounted may be stacked on each other to form a multi-layer structure. However, this method requires sophisticated and complicated stacking techniques.

Thus, stacking a plurality of functional chips, such as semiconductor chips, which must be integrated by an integration technique, has required complicated stacking techniques and has not been capable of readily achieving high mounting density.

SUMMARY OF THE INVENTION

An object of the present invention is to provide a functional chip that enables mounting density to be readily improved.

Another object of the present invention is to provide a stack structure in which a plurality of such functional chips are stacked on each other.

In order to achieve the above object, according to one aspect of the present invention, there is provided a functional chip comprising: a functional element having first and second surfaces opposed to each other; first and second insulating films respectively disposed on the first and second surfaces of the functional element; and first and second magnetic films respectively disposed on the first and second insulating films, the first and second magnetic films being divided into minute regions and magnetized such as to have magnetic poles arranged in a prescribed pattern.

According to another aspect of the present invention, there is provided a functional chip stack structure comprising: a plurality of functional chips stacked on each other, each of the functional chips having a pair of opposed surfaces, and first and second magnetic films individually disposed on the pair of opposed surfaces, the first and second magnetic films being divided into minute regions and magnetized such as to have magnetic poles arranged in a prescribed pattern, wherein in each pair of functional chips, among the functional chips, which are stacked on each other, the first magnetic film of one of the pair of functional chips is held against the second magnetic film of the other functional chip by magnetic force.

DESCRIPTION OF THE PREFERRED EMBODIMENTS

Embodiments of the present invention will now be described with reference to the accompanying drawings.

Figure 1A:
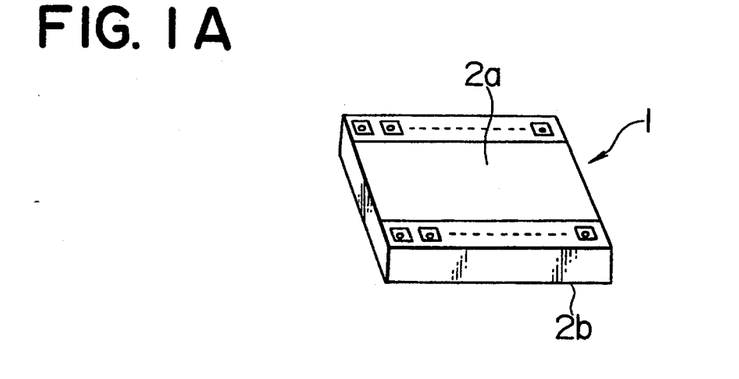
FIGS. 1A and 1B are a perspective view and a plan view, respectively, showing a semiconductor chip according to an embodiment of the present invention.
Figure 1B:
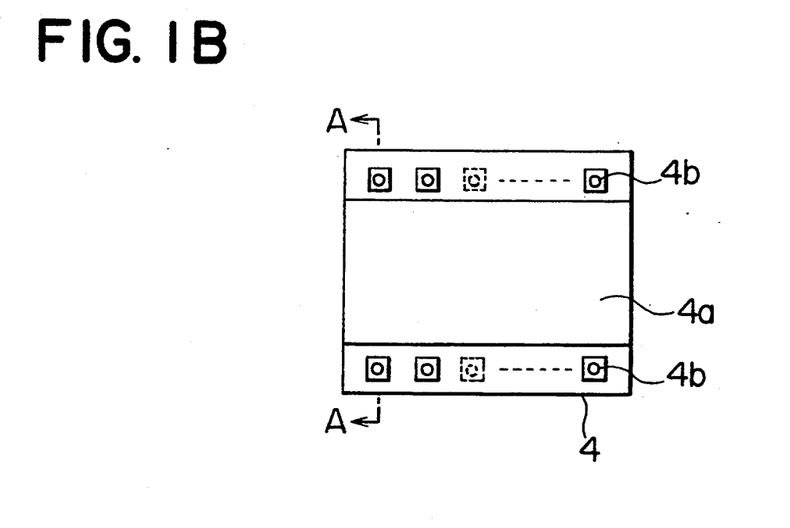
Figure 1C:
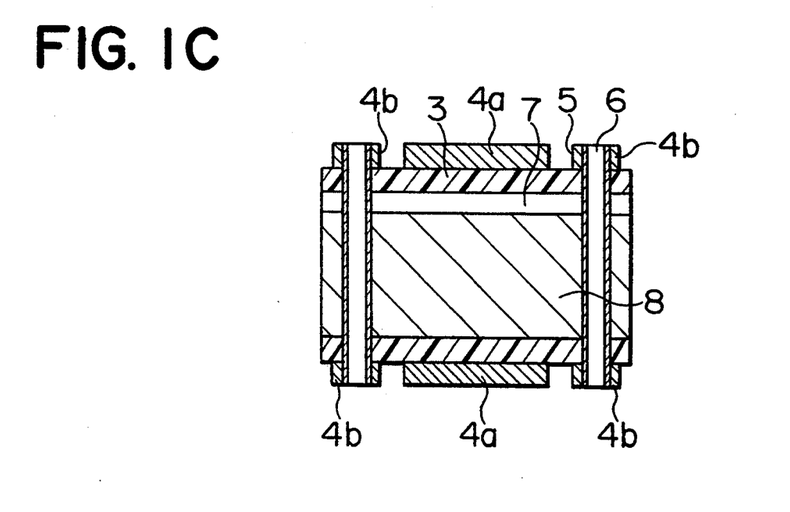
FIG. 1C is a sectional view taken along line A—A shown in FIG. 1B.

Referring to FIGS. 1A to 1C, a semiconductor chip 1, serving as a functional chip according to an embodiment of the present invention, has a pair of outer surfaces opposed to each other, that is, an upper surface 2a and a lower surface 2b. A semiconductor chip which may be used as the semiconductor chip 1 is obtained by forming an integrated circuit on a wafer, checking the wafer, subjecting the wafer to a prescribed process, and cutting the wafer into chips.

The semiconductor chip 1 also has insulating films 3 on the upper and lower surfaces 2a and 2b of the chip 1, respectively, and magnetic films 4 formed on the insulating films 3, respectively, by a CVD method. Each of the magnetic films 4 is separated into a bonding portion 4a subjected to magnetic polarization and having a smooth surface, and terminal portions 4b having a width of approximately 100 μm and capable of being connected to a desired external portion. Grooves 5 separate the terminal portions 4b from the bonding portion 4a so as to prevent contact therebetween. The semiconductor chip 1 further has an integrated circuit section 7 on a side of the chip 1 close to the upper surface 2a, the section 7 having a plurality of circuit elements and being included in a functional element of the chip 1 having the integrated circuit section 7 and a substrate 8 on which the section 7 is disposed. One of the insulating films 3 is disposed on the insulated circuit section 7. The insulating films 3 contain a magnetic shielding material as well as an insulating material.

Figure 2:
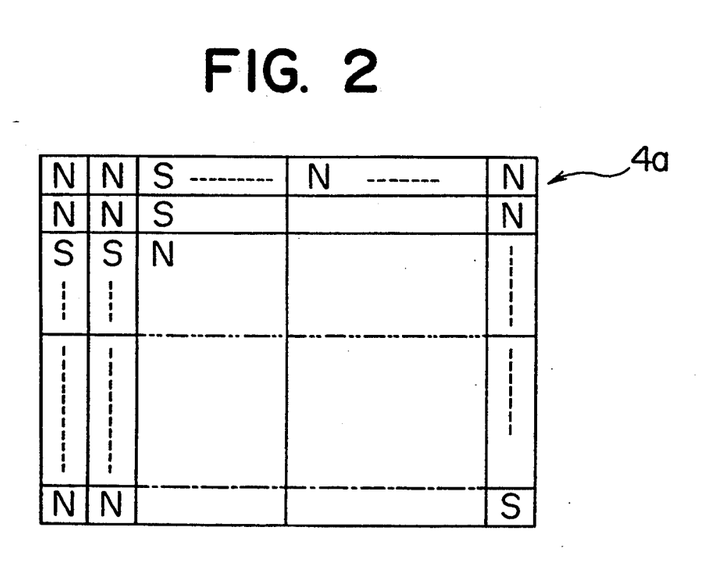
FIG. 2 is a diagram showing a pattern in which magnetic poles are arranged in bonding portions of magnetic films of the semiconductor chip.

The bonding portion 4a of each magnetic film 4 is divided into minute regions of N and S poles, as shown in FIG. 2. The N and S poles are arranged in accordance with a prescribed pattern for magnetic pole arrangement, described later with reference to FIG. 3. A through hole 6 with a diameter of approximately 80 μm is cut through each terminal portion 4b by using a drill, a laser or the like. The inner walls of the through holes 6 are plated with aluminum. The through holes 6 allow the integrated circuit section 7 on the substrate 8 and below the corresponding insulating film 3 to be connected with a desired external portion.

As shown in FIG. 2, the bonding portion 4a of each magnetic film 4 is divided into minute regions which are magnetized into N poles and S poles arranged by repeating a prescribed pattern of magnetic pole arrangement. That is, the entire area of the bonding portion 4a of the magnetic film 4 is subjected to a magnetizing operation such that N and S poles are arranged in a prescribed repeated pattern, so that when, for example, each minute region has an area of 100 μm square, each 1 mm square of the bonding portion 4a is divided into 10×10 minute regions.

Figure 3:
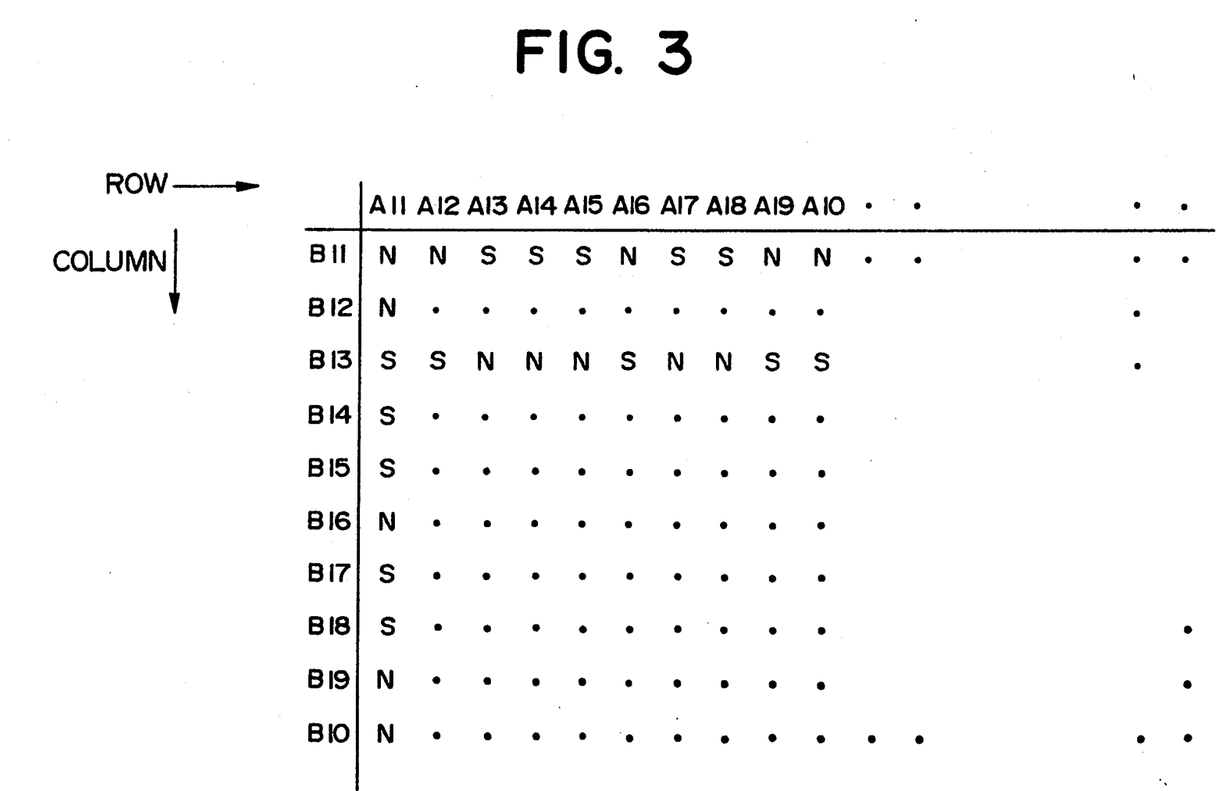
FIG. 3 is a diagram schematically showing the magnetic pole arrangement pattern shown in FIG. 2.

Referring to FIG. 3, in a magnetic pole arrangement pattern, N poles and S poles are arranged in a plurality of rows B11 to B19, B10, etc. and columns A11 to A19, A10, etc. Row B11 contains N and S poles arranged in an array pattern "N, N, S, S, S, N, S, S, N, N, . . . (where symbols N and S represent N poles and S poles, respectively)", and column A11 contains N and S poles also arranged in the array pattern "N, N, S, S, S, N, S, S, N, N, . . .". In a row or column starting with an S pole, such as row B13, N and S poles are arranged in the reverse array pattern "S, S, N, N, N, S, N, N, S, S, . . .". This principle is maintained in both patterning with the above array pattern throughout rows B11 to B19 and B10 and similar patterning throughout columns A11 to A19 and A10.

Suppose the semiconductor chip 1 shown in FIGS. 1A to 1C has a certain magnetic film 4 on an upper surface 2a thereof which has a bonding portion 4a subjected to magnetic polarization such as to form magnetic poles arranged in the pattern shown in FIG. 3, and a second semiconductor chip 1' is to be superimposed on the semiconductor chip 1. If the second semiconductor chip 1' that is to be disposed on the first semiconductor chip 1 has a lower surface 2b' on which a bonding portion 4a' of a magnetic film 4' is subjected to magnetization to form magnetic poles arranged in a pattern reverse to the pattern on the upper surface 2a of the first semiconductor chip 1, it is possible for N and S poles on one of the chips to be exactly superimposed on S and N poles, respectively, of the other chip provided that the pair of chips are superimposed on each other in their correct positions.

Figure 4:
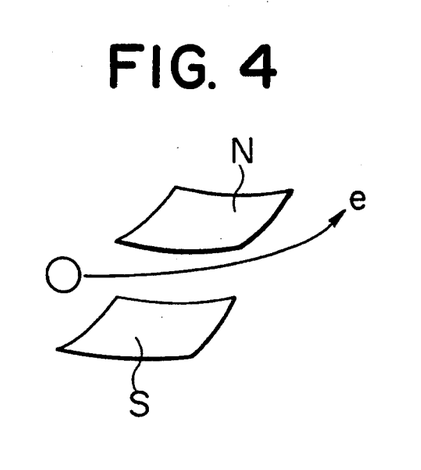
FIG. 4 is a view for explaining the relationship between a magnetic pole arrangement on an upper surface of the semiconductor chip and a magnetic pole arrangement on a lower surface of the same.

It is necessary for the semiconductor chip 1 to be subjected to magnetization such that, in the single semiconductor chip 1, a magnetized region on the upper surface 2a and a magnetized region on the lower surface 2b at corresponding positions are magnetized with the same polarity. This is because if such magnetized regions on the upper and lower surfaces 2a and 2b are magnetized with unlike polarities, electrons e moving in the integrated circuit section 7 are deflected, as shown in FIG. 4. In view of this fact, it is necessary that every semiconductor chip 1 in one of the alternating layers, for example, in an even numbered layer and every semiconductor chip 1 in the other layers, for example, in odd layers, should each have the same polarity at corresponding positions on the upper and lower surfaces 2a and 2b thereof, and that those semiconductor chips 1 in even layers have a magnetic pole arrangement pattern reverse to that of the semiconductor chips 1 in odd layers.

Figure 5:
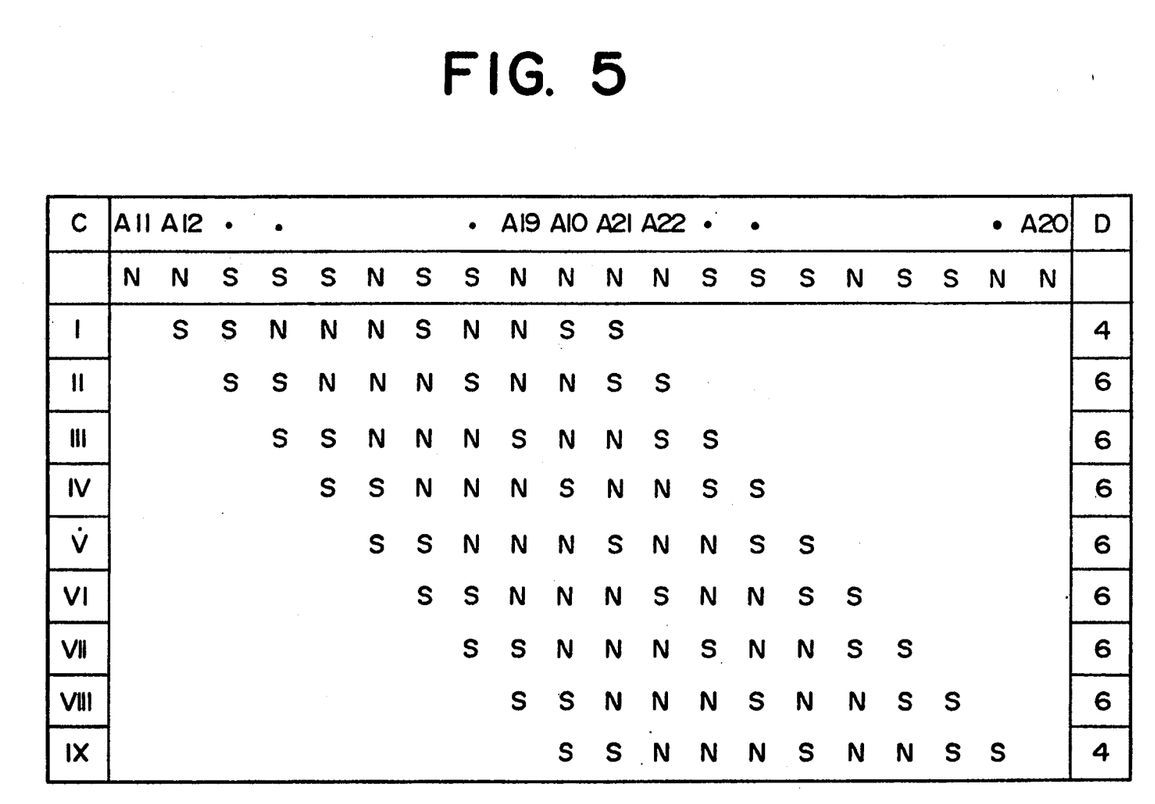
FIG. 5 is a diagram for explaining differences in bonding force caused by deviations in bonding positions when a plurality of semiconductor chips are bonded together.

When first and second semiconductor chips of the type shown in FIGS. 1A to 1C, which have magnetic films 4 with bonding portions 4a having magnetic poles arranged in the prescribed pattern, are superimposed on each other, if the second semiconductor chip is stacked at a position deviated by 100 μm from the first semiconductor chip, the second semiconductor chip will have an array pattern I of magnetic poles shown in FIG. 5. While those ten magnetic poles at column positions A11 to A19 and A10 of the first semiconductor chip are arranged in the array pattern "N, N, S, S, S, N, S, S, N, N," those ten magnetic poles at corresponding positions of the second semiconductor chip are arranged in array pattern I, that is, "X, S, S, N, N, N, S, N, N, S (where X represents a magnetized region)". As a result, within ten magnetic poles in the array pattern, magnetic poles at four positions of the second semiconductor chip have the same polarities as magnetic poles at four corresponding positions of the first semiconductor chip, and the former repel the latter. Thus, four magnetic poles out of ten do not contribute to attraction, with the result that the second semiconductor chip is held to the first semiconductor chip with a force only amounting to 2 in contrast with the force, amounting to 10, with which the semiconductor chips can be held together when the magnetic poles are completely matched.

FIG. 5 shows, in column headlined "D", the number of pairs of repelling magnetic poles which occur when the second semiconductor chip is stacked with its array pattern I to IX of magnetic poles deviated by lengths of 100 μm with respect to the array pattern "N, N, S, S, S, N, S, S, N, N" in which ten magnetic poles of the first semiconductor chip are arranged at the column positions A11 to A19, and A10.

As will be seen from FIG. 5, when the second semiconductor chip is stacked at a position deviated by 200 μm from the first semiconductor chip, six out of ten magnetic poles in the array pattern of the second semiconductor chip have the same polarities as, and hence, repel, magnetic poles at corresponding positions of the first semiconductor chip. As a result, the second semiconductor chip is not held to the first semiconductor chip. The second semiconductor chip having array pattern II to VIII, which is deviated by 200 to 800 μm from the first semiconductor chip, includes six magnetic poles repelling six magnetic poles at corresponding positions of the first semiconductor chip. As a result, the second semiconductor chip may not be held readily. The second semiconductor chip having array pattern IX deviated by 900 μm from that of the first semiconductor chip is bonded with a bonding force only amounting to 2 in terms of the above-described scale.

The second semiconductor chip at a position deviated by 1000 μm, i.e., 1 mm, has exactly the same array pattern as that of the first semiconductor chip, and is thus capable being held thereto. A positional deviation by a distance of 1 mm or thereabout can be visually recognized. This means that a plurality of semiconductor chips may be stacked on each other in the following manner: while a semiconductor chip or chips on lower layers are retained, a semiconductor chip to be stacked on an upper layer is moved relative to the immediately lower chip with a force amounting to 8 in a suitable direction or directions on the plane of stacking until the semiconductor chip to be stacked is brought to a position at which it no longer moves. At this position, the semiconductor chip is precisely stacked with its terminal portions 4b contacting corresponding terminal portions 4b of the immediately lower semiconductor chip. Although the foregoing explanation with reference to FIG. 5 concerns horizontal rows, a similar explanation is possible regarding vertical columns.

Figure 6:
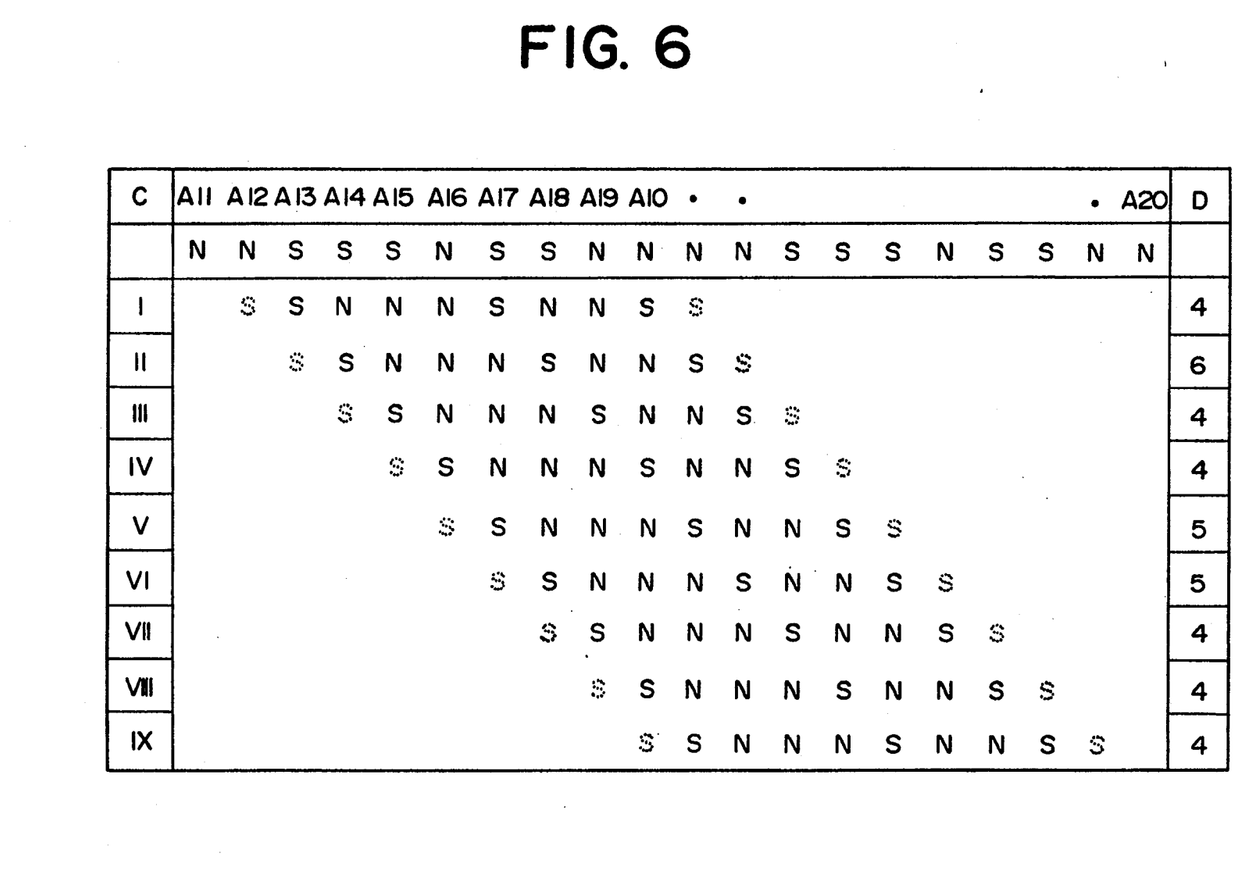
FIG. 6 is a diagram for explaining bonding force obtainable when semiconductor chips according to another embodiment of the present invention are bonded together.

A plurality of upper semiconductor chips to be stacked on, for example, even layers, may have array patterns of magnetic poles shown in FIG. 6. In each of these array patterns I to IX, among ten magnetic poles arranged in one of the array patterns shown in FIG. 5, the S poles at the first and last positions of the array pattern are omitted, that is, regions at these positions are not magnetized but remain as blank regions (the omitted S poles or blank regions are indicated by broken lines in FIG. 6). In this case, as shown in the column headlined D in FIG. 6, at least four magnetic poles out of eight magnetic poles repel magnetic poles at corresponding positions. A plurality of such semiconductor chips are stacked on each other in a manner similar to that described above, that is, by moving a semiconductor chip to be stacked on an upper layer relative to the semiconductor chip immediately below a suitable direction or directions on the plane of stacking until the relevant semiconductor chip is brought to a position at which it no longer moves. At this position, the semiconductor chip is stacked precisely, and is readily held.

Figure 7:
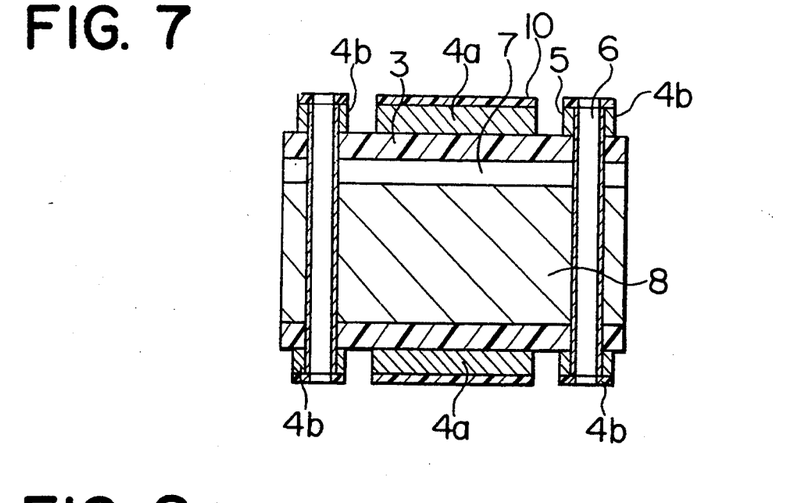
FIG. 7 is a sectional view of a semiconductor chip according to still another embodiment of the present invention.

When a semiconductor chip has an array pattern of the type shown in FIG. 5 which is not deviated by 100 μm but is deviated by 25 μm, this semiconductor chip is held to another semiconductor chip with a force amounting to 8 in terms of the above scale. In this case, there is a risk that a terminal portion 4b of one of the semiconductor chips may contact a bonding portion 4a of the other semiconductor chip. Such contact can be prevented if, in the semiconductor chips, the size of intervals between terminal portions 4b or the width of the grooves between the terminal portions 4b and a bonding portion 4a is within a range from 50 to 100 μm. However, contact may occur between a terminal portion 4b and a bonding portion 4a when a plurality of such semiconductor chips are stacked into a multi-layer structure. In this case, therefore, it is preferable that the magnetic films 4 be covered with contact-preventing films 10, as shown in FIG. 7.

In using the contact-preventing films 10, however, it is necessary to give consideration to the fact that the use of the films 10 may decrease magnetic force. In addition, consideration must be given to the fact that a magnetic pole arrangement pattern including blank regions does not involve bonding force completely equal to 0 even when there are positional deviations, and that, in the case shown in FIG. 6, magnetic force may reduced from the level 8 to 9, when compared with the case shown in FIG. 5.

Figure 8:
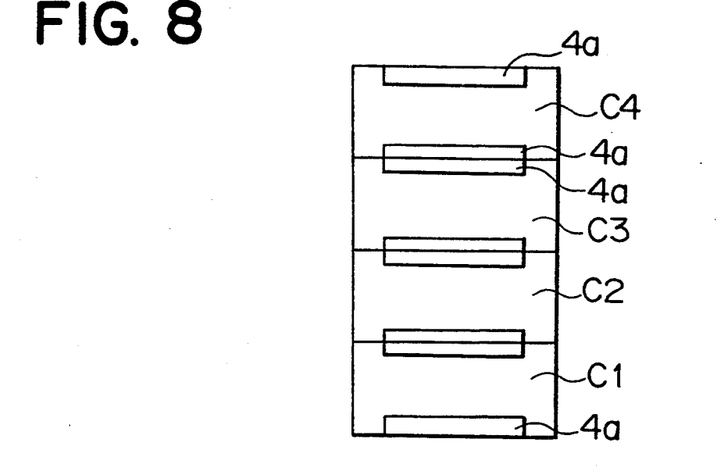
FIG. 8 is a front view of a stack structure in which four semiconductor chips according to the embodiment shown in FIGS. 1A to 1C are stacked on each other.

Next, descriptions will be given of a case in which semiconductor chips, such as 4M DRAMs, each constructed as shown in FIGS. 1A to 1C, are stacked on each other into a four-layer 16M DRAM, as shown in FIG. 8.

The first of the semiconductor chips C1 is retained by an apparatus capable of producing a vacuum at the bottom of the semiconductor chip C1. Then, a second semiconductor chip C2 is grasped by vacuum force by using, for example, a suction tube, and the semiconductor chip C2 is moved relative to the semiconductor chip C1 with a force at level 8 if the semiconductor chips C1 and C2 can be completely held together with a force at level 10.

When the semiconductor chip C2 no longer moves, it is brought to a position at which the chip C2 is precisely stacked. When the semiconductor chip C2 has been brought to such a non-movable position, or when it has been confirmed that the chip C2 is stacked at a correct position with a checking apparatus capable of radiating a laser beam from above the chip C2, the regions on which the semiconductor chips C1 and C2 are to be bonded to each other are bonded by a YAG laser, solder, or the like generally used in mounting chips on printed circuit boards. Semiconductor chips C3 and C4 are bonded subsequently in a similar manner. When a heat dissipating plate is required, a chip to serve as a heat dissipating plate is interposed by a similar method between, for example, the semiconductor chips C2 and C3.

The above-described magnetic films 4 may comprise a film of the type usable as a double-layer alloy medium for vertical magnetic recording, which medium has a Co-Cr layer and a Ni-Fe layer and constitutes a current research subjects. For this purpose, a Fe/Ni film is formed by using a gas mixture of ferrocene and nickelocene, and radiating with light from a nitrogen laser, and then a Co/Cr film is formed by a CVD method. The use of a film of this type makes it possible to effect vertical magnetization, so that it is possible to increase magnetic flux density, and hence, to obtain a strong magnetic force. Magnetic films 4 in which vertical magnetization can take place may be formed by dispersing fine ferrite particles on a magnetic coating. Also, it is possible to form a strong thin-film magnet by using a material for magneto-optic memories.

A four-layer DRAM structure having the above-described construction may be used in combination with a lead frame of a currently used type. A relatively deep recess is formed at a location of the lead frame at which the semiconductor chips are to be placed, the semiconductor chips are placed on the lead frame, and the entire structure is finished as a product by a method conventionally used, thereby obtaining a stack structure of 4M DRAM semiconductor chips.

Figure 9:
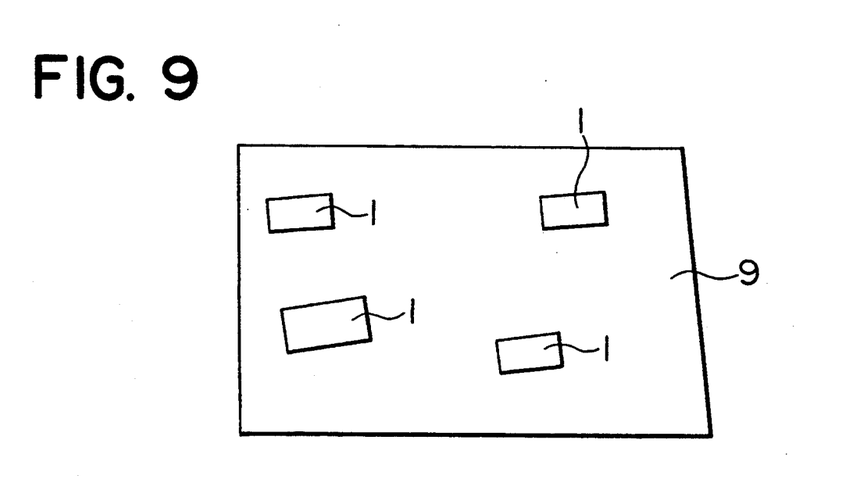
FIG. 9 is a plan view of a printed circuit board on which semiconductor chips according to the embodiment shown in FIGS. 1A to 1C are mounted.

As shown in FIG. 9, semiconductor chips 1, each constructed as shown in FIGS. 1A to 1C, may be mounted on a printed circuit board 9 by the above-described method utilizing magnetic force after aluminum wires are provided, and suitably covered with insulating films 3. At desired locations of the printed circuit board 9, a magnetic film, similar to a magnetic film 4 of a chip 1, has a bonding portion, similar to a bonding portion 4a, which is subjected to magnetization such as to have magnetic poles arranged in a prescribed pattern, and also has terminal portions, similar to terminal portions 4b. Using the semiconductor chips 1 in this way makes it possible to produce a product which may be incorporated in a microprocessor, a television receiver or the like.

While very high mounting density is required in super computers and high-definition television receivers, the present invention makes it possible to meet this requirement. That is, the present invention makes it possible to produce IC memories capable of replacing optical memories and magnetic memories. The present invention also makes it possible to produce a liquid crystal display which provides a simple matrix display with each scanning line comprising forty scanning lines.

What is claimed is:

1. A functional chip comprising:
   a functional element having first and second surfaces opposed to each other;
   first and second insulating films respectively disposed on said first and second surfaces of said functional element; and
   first and second magnetic films respectively disposed on said first and second insulating films, said first and second magnetic films being divided into regions and magnetized within the regions to have magnetic poles arranged in a prescribed pattern.

2. The functional chip according to claim 1 wherein said first and second magnetic films have magnetic poles of a like polarity at positions of said first and second magnetic films corresponding to each other.

3. The functional chip according to claim 1 wherein said first and second magnetic films have magnetic pole patterns including at least one region which is not magnetized.

4. The functional chip according to claim 1 wherein said first and second insulating films contain a magnetic shielding material.

5. The functional chip according to claim 1 wherein said functional element comprises a semiconductor element having a substrate and an integrated circuit on said substrate.

6. The functional chip according to claim 1 comprising an electrically conductive material extending through said functional element and said first and second insulating films and terminals at each end of said electrically conductive material and separated from said first and second magnetic films.

7. The functional chip according to claim 6 comprising contact-preventing films on said first and second magnetic films and on said terminals.

8. The functional chip according to claim 1 wherein said first and second magnetic films are magnetized in directions perpendicular to said magnetic films.

9. The functional chip according to claim 1 wherein said first and second magnetic films each comprise a double-layer alloy film including a Co-Cr layer and a Ni-Fe layer.

10. The functional chip according to claim 1 wherein said first and second magnetic films contain a magnetic coating material and fine ferrite particles.

11. A functional chip stack structure comprising a plurality of functional chips stacked on each other, each of said functional chips having a pair of opposed surfaces, and first and second magnetic films respectively disposed on said pair of opposed surfaces, said first and second magnetic films being divided into regions and magnetized in the regions to have magnetic poles arranged in a prescribed pattern, wherein, in each pair of functional chips which are stacked on each other, the first magnetic film of one of said pair of functional chips is held to the second magnetic film of the other functional chip by magnetic force.

12. The stack structure according to claim 11 wherein the first magnetic film of one of said pair of functional chips and the second magnetic film of the other of said pair of functional chips that are held to each other have magnetic poles of unlike polarities at corresponding positions of the first and second magnetic films.

* * * * *